United States Patent
Wang

(10) Patent No.: US 6,330,906 B1
(45) Date of Patent: Dec. 18, 2001

(54) HEAT SINK WITH FLANGED PORTIONS AND SPACED APART METAL RADIATING FINS

(75) Inventor: Mei-Cheng Wang, Taipei (TW)

(73) Assignees: Chuan Sheng Corporation, Inc.; Shu-Chen Teng, both of (TW)

( * ) Notice: Subject to any disclaimer, the term of this patent is extended or adjusted under 35 U.S.C. 154(b) by 0 days.

(21) Appl. No.: 09/709,399

(22) Filed: Nov. 13, 2000

(51) Int. Cl.[7] .................................................. F28F 7/00
(52) U.S. Cl. .................. 165/80.3; 165/185; 361/697; 361/709; 257/722; 174/16.3
(58) Field of Search ................... 165/80.3, 185, 165/121; 361/697, 704, 710; 257/722; 174/16.3

(56) References Cited

U.S. PATENT DOCUMENTS

| 5,020,586 | * | 6/1991 | Mansingh | 165/185 |
|---|---|---|---|---|
| 5,406,451 | * | 4/1995 | Korinsky | 361/697 |
| 5,886,870 | * | 3/1999 | Omori | 361/704 |
| 5,947,192 | * | 9/1999 | Kuo | 165/80.3 |
| 6,062,301 | * | 5/2000 | Lu | 165/80.3 |
| 6,076,594 | * | 6/2000 | Kuo | 165/80.3 |
| 6,104,609 | * | 8/2000 | Chen | 361/695 |
| 6,125,921 | * | 10/2000 | Kuo | 165/80.3 |
| 6,199,627 | * | 3/2001 | Wang | 165/185 |

* cited by examiner

Primary Examiner—Ira S. Lazarus
Assistant Examiner—Terrell McKinnon
(74) Attorney, Agent, or Firm—Bacon & Thomas PLLC

(57) ABSTRACT

A heat sink. The heat sink is constructed to include a substantially U-shaped metal rack defining a receiving space, and metal radiating fins are secured with two tie rods and fastened to the receiving space of the metal rack preferably by welding. The metal radiating fins each have two mounting holes that are disposed at two diagonal corners. The metal tie rods are respectively mounted in the mounting holes of the metal radiating fins and peripherally flanged by a press to hold down the metal radiating fins in parallel spacing with each other.

8 Claims, 5 Drawing Sheets

HEAT SINK WITH FLANGED PORTIONS AND SPACED APART METAL RADIATING FINS

BACKGROUND OF THE INVENTION

1. Field of the Invention

The present invention relates to a heat sink and, more particularly, to such a heat sink, which uses two tie rods to hold a set of metal radiating fins in parallel, and a metal rack to hold the tie rod and radiating fin assembly.

2. Description of the Related Art

During the operation of a portable computer, for example, a palm-top or notebook computer, the CPU produces much heat, and heat must be quickly carried away from the CPU so as not to affect normal function of the CPU and the related electronic parts. A variety of heat sinks have been disclosed for this purpose. FIG. 6 shows a heat sink according to the prior art. This structure of heat sink A is extruded from aluminum, comprising a flat bottom wall A2, and upright radiating fins A1 arranged in parallel on the topside of the flat bottom wall A2. When in use, the flat bottom wall is attached to the surface of the CPU, and a fan is mounted on the upright radiating fins A1 at the top. FIG. 7 shows another structure of heat sink according to the prior art. This structure of heat sink comprises a metal bottom panel C, and a radiating fin body B fixedly mounted on the metal bottom panel C. The radiating fin body B is a narrow, elongated, thin sheet of metal bent into shape, comprising a plurality of radiating fin segments B1 arranged in parallel. According to the aforesaid two different structures of heat sink, the pitch between the radiating fins A1 or parallel radiating fin segments B1 of the radiating fin body B cannot be minimized to the satisfactory state. When increasing the density of the radiating fins A1 or radiating fin segments B1, the thickness of the metal sheet material must be relatively reduced, however a thin thickness of metal sheet material tends to be broken when bending. In order to increase the density of radiating fins, thin spacer means may be used to separate radiating fins from one other after the installation of tie rods means in the radiating fins. This measure complicates the fabrication of the heat sink, and also increases the manufacturing cost of the heat sink. There is also known another structure of heat sink according to the prior art, in which the metal bottom panel has parallel dovetail grooves, and the radiating fins each have a dovetail flange respectively forced into engagement with the dovetail grooves of the metal bottom panel. When fastening the radiating fins to the dovetail grooves of the metal bottom panel, the radiating fins may be forced to break.

SUMMARY OF THE INVENTION

The present invention has been accomplished to provide a heat sink, which eliminates the aforesaid drawbacks. It is the main object of the present invention to provide a heat sink, which has a plurality of radiating fins arranged densely for quick dissipation of heat. It is another object of the present invention to provide a heat sink, which is easy and inexpensive to manufacture. To achieve these objects, the heat sink of the present invention comprises a substantially U-shaped metal rack defining a receiving space, and a plurality of metal radiating fins tied up with two tie rods and then fastened to the receiving space of the metal rack by welding. The metal radiating fins each have two mounting holes disposed in two diagonal corners. The metal tie rods respectively mounted in the mounting holes of the metal radiating fins, and then peripherally flanged by a press to hold down the metal radiating fins in parallel.

DETAILED DESCRIPTION OF THE PREFERRED EMBODIMENT

Figure 1:
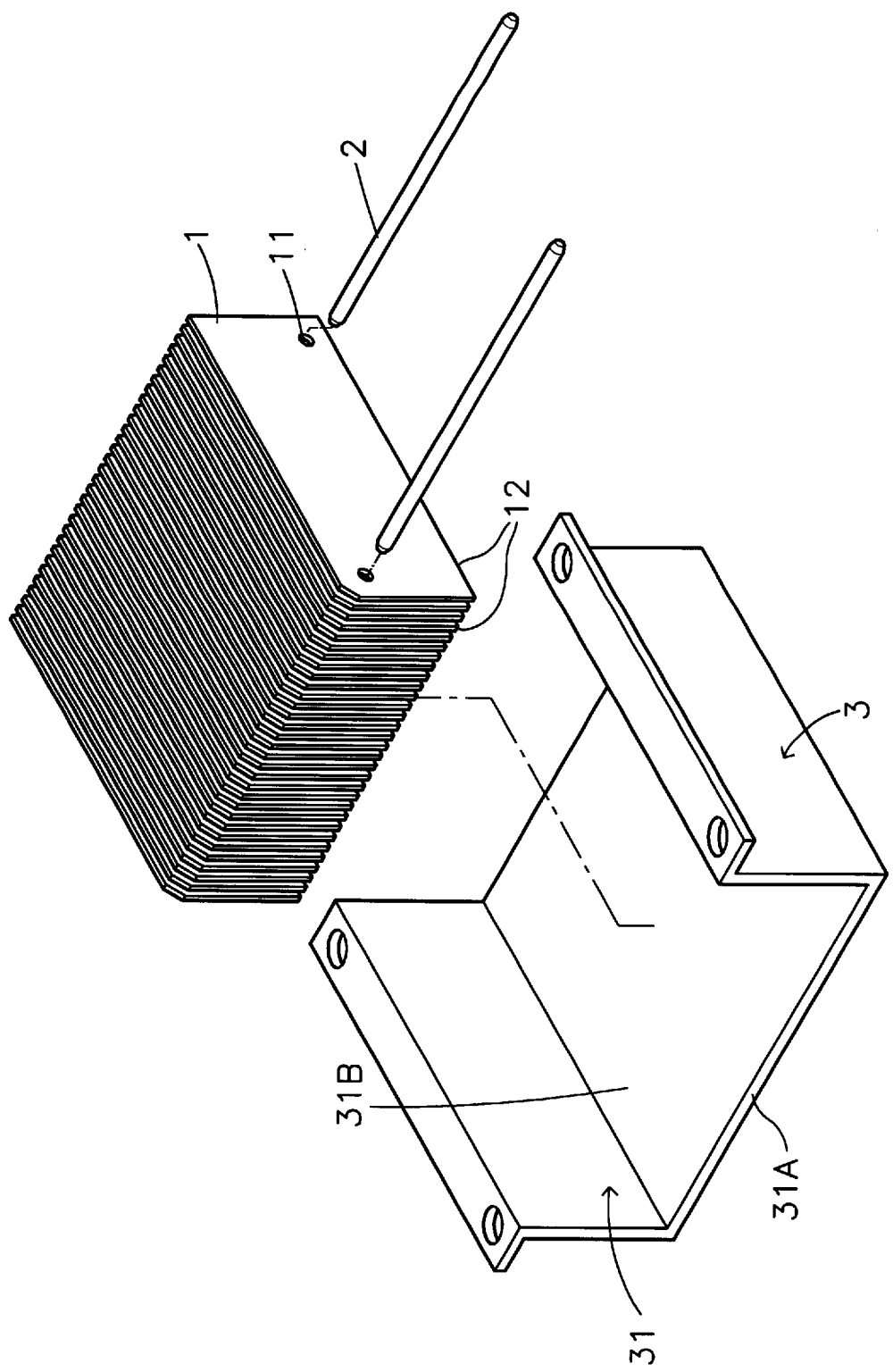
FIG. 1 is an exploded view of a heat sink constructed according to the present invention.
Figure 3:
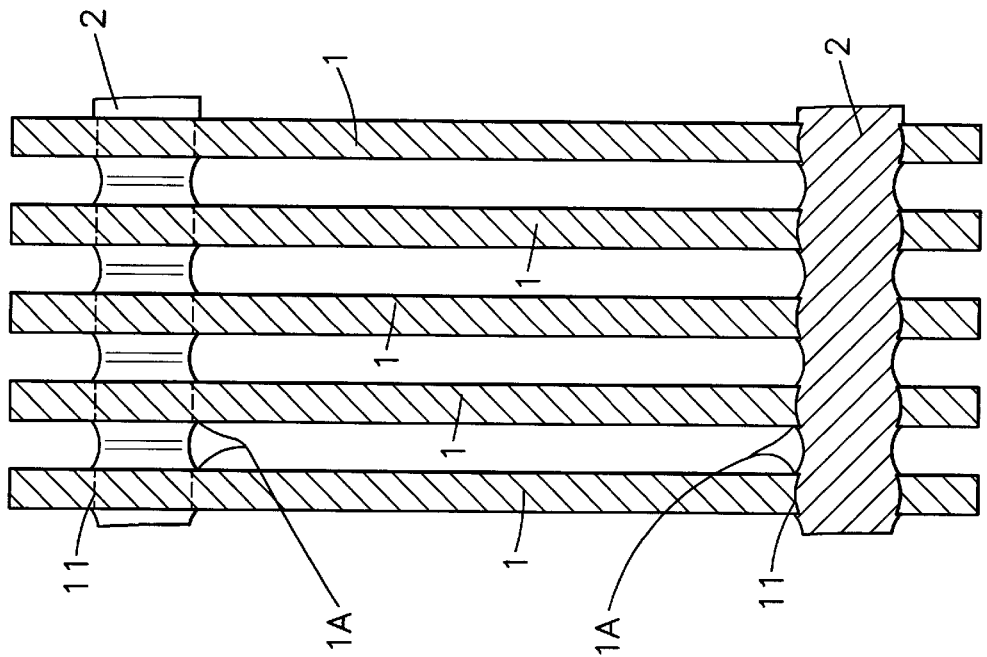
FIG. 3 is similar to FIG. 2 but showing the tie rods peripherally flanged.
Figure 2:
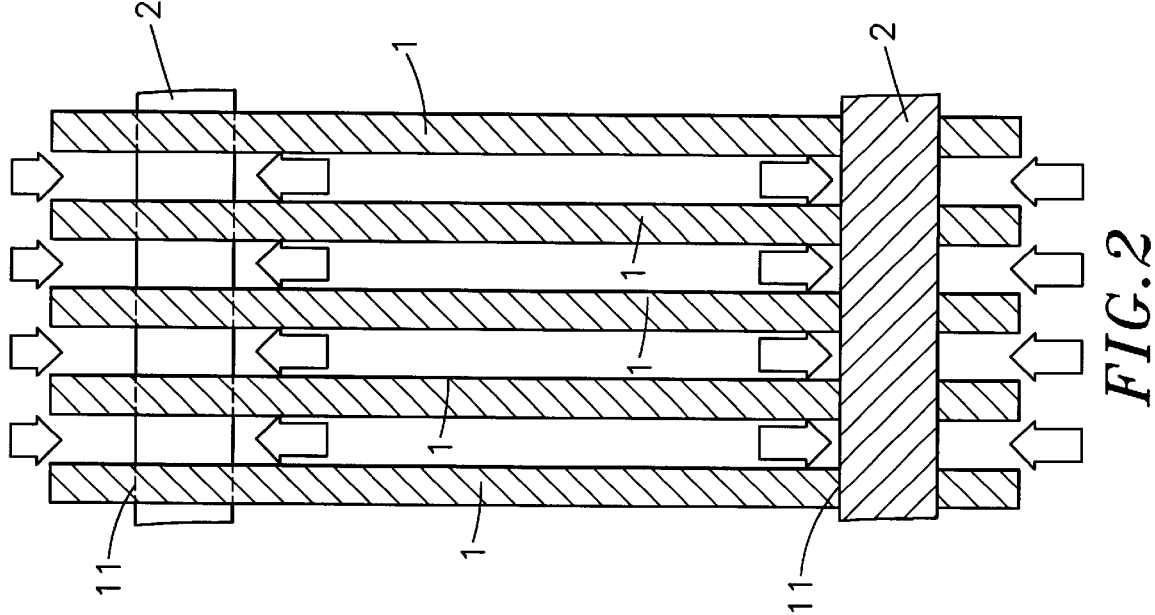
FIG. 2 is a top view in section showing the tie rods fastened to the mounting holes of the radiating fins before the deformation process according to the present invention.

Referring to FIGS. from 1 through 3, a heat sink in accordance with the present invention is generally comprised of a metal casing 3, a stack of metal radiating fins 1, and two metal tie rods 2. The radiating fins 1 each have two mounting holes 11 disposed in two diagonal corners. The tie rods 2 are respectively inserted through the mounting holes 11 of the radiating fins 1 (see FIG. 2), and deformed by a machine or tool (for example a press) to become peripherally flanged (see FIG. 3), enabling the radiating fins 1 to be positively held down in parallel by the flanged portions of the tie rods 2 and spaced from one another at an equal pitch (see FIGS. 1 and 3). The metal casing 3 has a substantially U-shaped cross section, defining a receiving space 31 adapted to receive the stack of radiating fins 1 and the tie rods 2 in the stack of radiating fins 1. The assembly of the radiating fins 1 and the tie rods 2 is then put in the receiving space 31 of the metal casing 3, keeping the radiating fins 1 perpendicularly attached to the bottom wall 31A of the metal casing 3, and then the bottom edge 12 of each radiating fin 1 is respectively welded to the top surface 31B of the bottom wall 31A of the metal casing 3. The radiating fins 1 are preferably made of aluminum, copper, or suitable thin sheet of metal material of high heat-conductivity. The radiating fins 1 may be perforated so that currents of air can pass through the pores (not shown) of the radiating fins 1.

Figure 4:
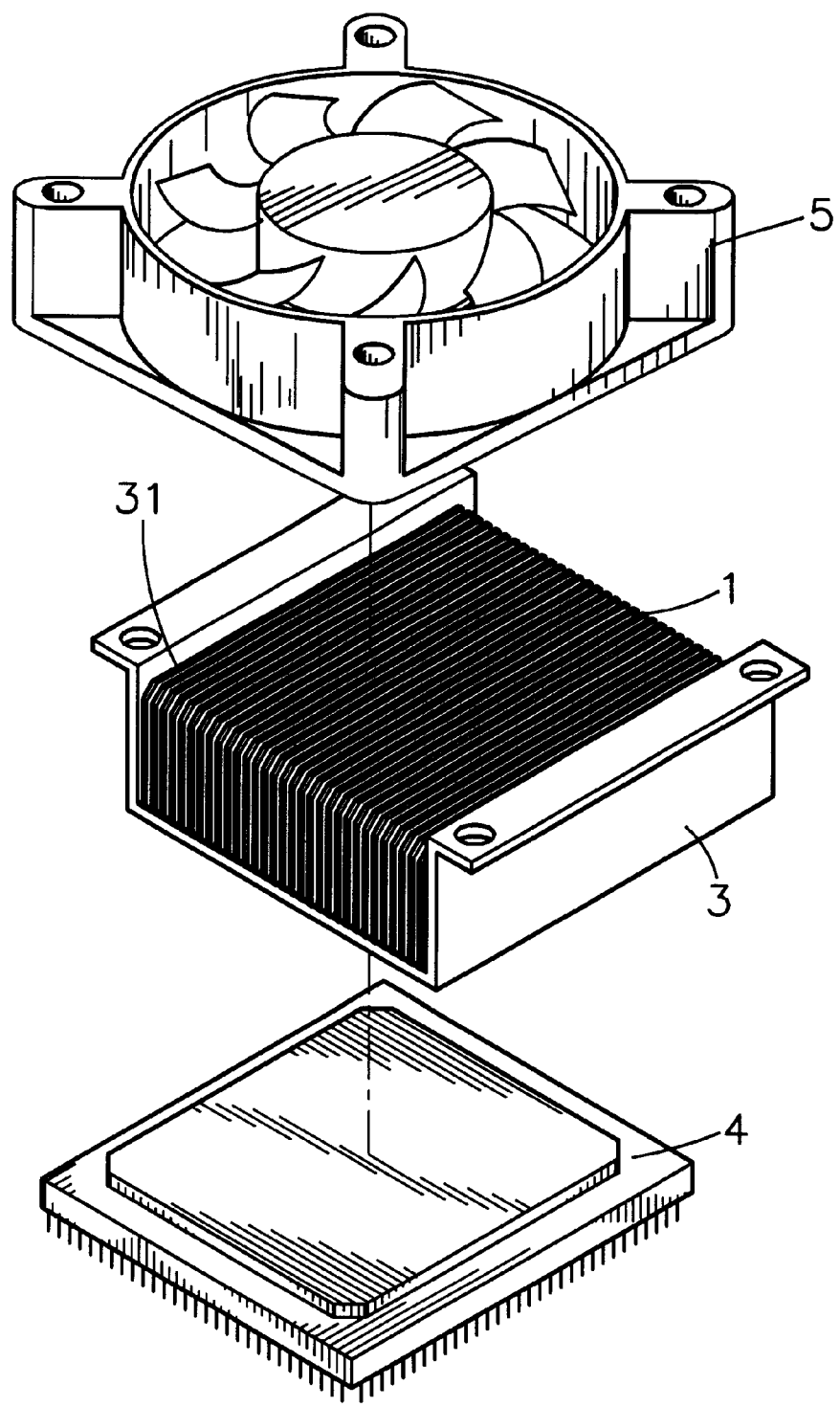
FIG. 4 is an exploded view showing an application example of the present invention.

Referring to FIG. 4, the metal casing 3 of the heat sink is closely attached to an electronic device, for example, a CPU 4, and a fan 5 is mounted on the radiating fins 1 at the topside. During the operation of the CPU 4, heat is transmitted from the CPU 4 through the metal casing 3 to the radiating fins 1, and fan 5 is driven to blow air toward the radiating fins 1, causing heat to be quickly dissipated from the radiating fins 1 into the air.

Figure 5:
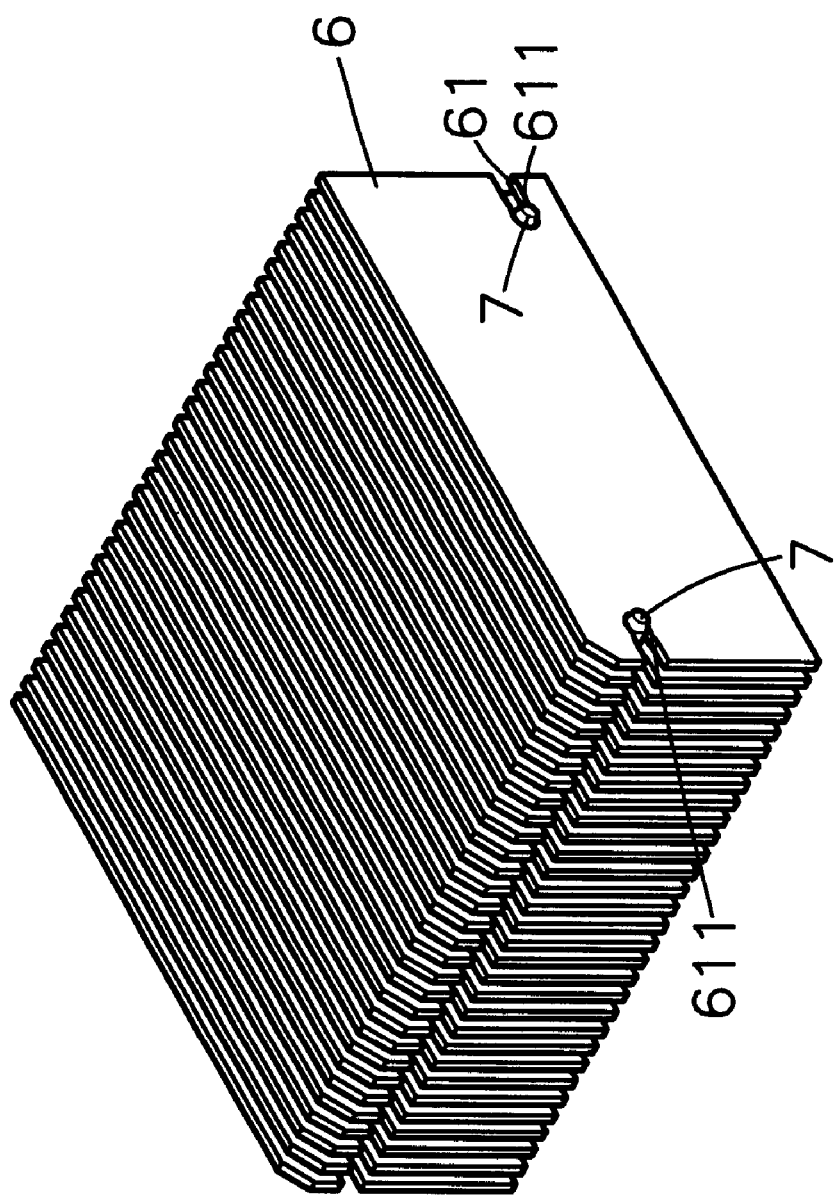
FIG. 5 shows an alternate form of the present invention.
Figure 6:
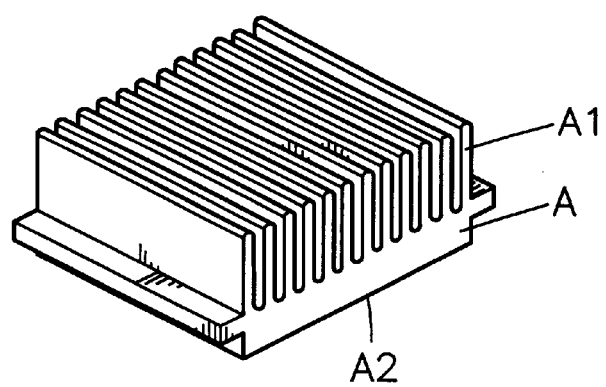
FIG. 6 is an elevational view of a heat sink according to the prior art.
Figure 7:
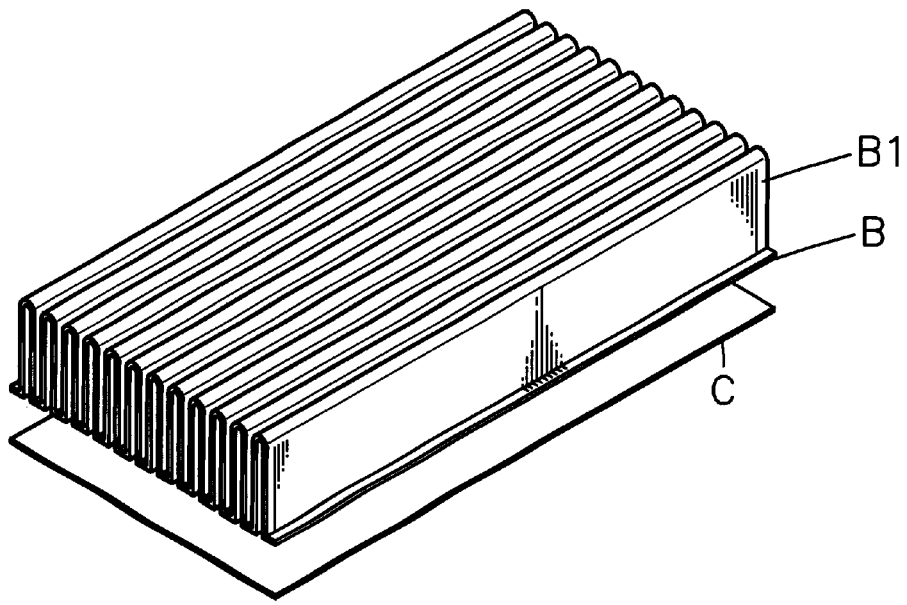
FIG. 7 shows another structure of heat sink according to the prior art.

FIG. 5 shows an alternate form of the present invention. According to this alternate form, the metal radiating fins 6 each have two mounting notches 61 diagonally disposed at two opposite short sides thereof and at least one protruding portion 611 respectively suspended in the mounting notches 61, and the two tie rods 7 are respectively attached to the mounting notches 61 of the radiating fins 6 and then deformed by a machine or tool (for example, a press) to become peripherally flanged, keeping the radiating fins 1 positively held down in parallel and spaced from one another at an equal pitch. The mounting notches 61 of each radiating fin 6 have a width gradually increased toward the periphery of the respective radiating fin 6, to that the tie rods 7 can easily be forced into the mounting notches 61 of the radiating fins 6.

According to the present invention, radiating fins 1 or 6 can easily be connected together and arranged in parallel at a high density for quick dissipation of heat from the CPU to which the heat sink is attached.

While only one embodiment of the present invention has been shown and described, it will be understood that various modifications and changes could be made thereunto without departing the spirit and scope of the invention disclosed.

What the invention claimed is:

1. A heat sink comprising:

a substantially U-shaped metal casing, said metal casing comprising a bottom wall with a top surface, a receiving space above the top surface;

a plurality of metal radiating fins mounted in the receiving space of said metal casing, the metal radiating fins spaced apart and parallel to each other, the metal radiating fins each including a bottom edge that is attached to the top surface of the bottom wall of the metal casing without contacting one another, the metal radiating fins each comprising two opposite mounting holes;

two metal tie rods, each of the metal tie rods mounted in a respective one of the mounting holes of the metal radiating fins in order to position the metal radiating fins such that the metal radiating fins are parallel to each other, the metal tie rods each comprising a plurality of flanged portions extending outwardly from the metal tie rods; and wherein adjacent ones of the flanged portions space apart adjacent ones of the metal radiating fins.

2. The heat sink as claimed in claim 1, wherein the tie rods are deformed by tool means to form the flanged portions of the metal tie rods at two opposite sides of each of the metal radiating fins, such that the flanged portions are adapted to maintain the metal radiating fins parallel to each other.

3. The heat sink as claimed in claim 1 wherein the mounting holes of each of the metal radiating fins are positioned diagonally from one another at two diagonal corners for each of the metal radiating fins.

4. The heat sink as claimed in claim 1, wherein the metal radiating fins each comprise a thin sheet of metal material of high heat conductivity.

5. The heat sink as claimed in claim 4, wherein the thin sheet of metal material is aluminum.

6. The heat sink as claimed in claim 4, wherein the thin sheet of metal material is copper.

7. The heat sink as claimed in claim 1, wherein the mounting holes of the metal radiating fins comprise side notches.

8. The heat sink as claimed in claim 7, wherein the metal radiating fins each further comprises side notches and at least one protruding portion respectively suspended at the side notches and adapted to engage the tie rods.

\* \* \* \* \*